(12) United States Patent
Bal et al.

(10) Patent No.: US 12,546,809 B2
(45) Date of Patent: Feb. 10, 2026

(54) CLOCK PHASE NOISE MEASUREMENT CIRCUIT AND METHOD

(71) Applicant: STMicroelectronics International N.V., Geneva (CH)

(72) Inventors: Ankur Bal, Greater Noida (IN); Sri Ram Gupta, Noida (IN)

(73) Assignee: STMicroelectronics International N.V., Geneva (CH)

( * ) Notice: Subject to any disclaimer, the term of this patent is extended or adjusted under 35 U.S.C. 154(b) by 785 days.

(21) Appl. No.: 17/969,315

(22) Filed: Oct. 19, 2022

(65) Prior Publication Data

US 2023/0168291 A1 Jun. 1, 2023

Related U.S. Application Data

(60) Provisional application No. 63/283,706, filed on Nov. 29, 2021.

(51) Int. Cl.
*G01R 29/26* (2006.01)
*H03K 3/03* (2006.01)
*H03K 3/037* (2006.01)

(52) U.S. Cl.
CPC ........... *G01R 29/26* (2013.01); *H03K 3/0315* (2013.01); *H03K 3/037* (2013.01)

(58) Field of Classification Search
CPC .. G01R 29/26; G01R 31/31709; G01R 29/02; H03K 3/0315; H03K 3/037; G04F 10/00; G04F 10/06
See application file for complete search history.

(56) References Cited

U.S. PATENT DOCUMENTS

| | | | |
|---|---|---|---|
| 4,669,089 | A | 5/1987 | Gahagan et al. |
| 5,402,443 | A | 3/1995 | Wong |

(Continued)

FOREIGN PATENT DOCUMENTS

WO 2007071674 A3 6/2007

OTHER PUBLICATIONS

A.H. Chan, G.W. Robert, "A Jitter Characterization System Using a Component-Invariant Vernier Delay Line", IEEE Transaction on Very Large Scale Integration Systems, vol. 12, No. 1, Jan. 2004.

(Continued)

*Primary Examiner* — Lisa M Caputo
*Assistant Examiner* — Michael J Singletary
(74) *Attorney, Agent, or Firm* — Crowe & Dunlevy LLC

(57) ABSTRACT

A measurement is made of jitter present in a jittery clock signal. A digital sinusoid generator circuit clocked by the jittery clock signal generates a pulse density modulation (PDM) signal corresponding to a sinusoid waveform. The PDM signal is converted by a sigma-delta modulator circuit to an oscillating frequency signal with an output of digital values digital values indicative of oscillating frequency signal phase. Responsive to the jittery clock signal, the digital values indicative of oscillating frequency signal phase are sampled. A digital differentiator circuit determines a digital difference between consecutive samples of the digital values indicative of oscillating frequency signal phase. The digital difference is processed by a digital signal processing circuit to generate a frequency spectrum and determine from signal-to-noise ratio a measurement of jitter in the jittery clock signal.

21 Claims, 2 Drawing Sheets

(56) References Cited

U.S. PATENT DOCUMENTS

| | | | |
|---|---|---|---|
| 6,184,812 | B1 | 2/2001 | Younis et al. |
| 7,151,474 | B2 | 12/2006 | Ortmanns et al. |
| 7,205,852 | B2 | 4/2007 | Perrott |
| 7,487,055 | B2 | 2/2009 | Le-Gall |
| 7,512,203 | B2 | 3/2009 | Eldredge et al. |
| 7,852,249 | B2 | 12/2010 | Oliaei |
| 8,036,333 | B2 | 10/2011 | Jeon |
| 8,164,500 | B2 | 4/2012 | Ahmed et al. |
| 8,169,352 | B2 | 5/2012 | Sornin et al. |
| 8,860,478 | B2 | 10/2014 | Chen et al. |
| 9,377,915 | B2 | 6/2016 | Park et al. |
| 9,716,509 | B2 | 7/2017 | Zhao |
| 10,797,684 | B1 | 10/2020 | Benz et al. |
| 10,862,503 | B2 | 12/2020 | Bal et al. |
| 2007/0164884 | A1 | 7/2007 | Ihs |
| 2007/0229326 | A1 | 10/2007 | Le-Gall |
| 2008/0077342 | A1* | 3/2008 | Ichiyama ......... G01R 31/31709 702/57 |
| 2009/0140896 | A1 | 6/2009 | Adduci et al. |
| 2010/0156686 | A1 | 6/2010 | Kim et al. |
| 2011/0182389 | A1 | 7/2011 | Breems et al. |
| 2014/0368367 | A1 | 12/2014 | Choi et al. |
| 2015/0270947 | A1 | 9/2015 | Tiwari et al. |
| 2018/0011142 | A1* | 1/2018 | Choo ..................... H03L 7/183 |
| 2020/0186162 | A1* | 6/2020 | Bal ........................ H03M 3/50 |
| 2021/0109563 | A1 | 4/2021 | Gharan et al. |

OTHER PUBLICATIONS

Chen, Tun-Shih, et al: "A 10GB/S Clock and Data Recovery Circuit With Binary Phase/Frequency Detector Using TSMC 0.35μm Sige Bicmos Process," 2004 IEEE Asia-Pacific Conference on Circuits and Systems, Dec. 6-9, 2004, 4 pages.

Dubois, et al: "Ternary Stimulus for Fully Digital Dynamic Testing of SC ΣΔ ADCs," 2012 IEEE 18th International Mixed-Signal, Sensors, and Systems Test Workshop, 2012 IEEE, pp. 5-10.

Hashimoto, et al: "Time-to-Digital Converter With Vernier Delay Mismatch Compensation for High Resolution On-Die Clock Jitter Measurement," 2008 Symposium on VLSI Circuits Digest of Technical Papers, 2008 IEEE, pp. 166-167.

Hsu et al: "BIST for Measuring Clock Jitter of Charge-Pump Phase-Locked Loops," IEEE Transactions on Instrumentation and Measurement, vol. 57, No. 2, Feb. 2008 (pp. 276-285).

Khalil, Waleed, et al: "A Self-Calirated On-Chip Phase-Noise Measurement Circuit With—75 dBc Single-Tone Sensitivity at 100 kHz Offset," IEEE Journal of Solid-State Circuits, vol. 42, No. 12, Dec. 2007, 8 pages.

Lee, et al: "A 9 b, 1.25 ps Resolution Coarse-Fine Time-to-Digital Converter in 90 nm CMOS that Amplifies Time Residue," IEEE Journal of Solid-State Circuits, vol. 43, No. 4, Apr. 2008, pp. 769-777.

Lee, et al: "A Low Noise, Wideband Digital Phase-Locked Loop Based on a New Time-to-Digital Converter With Subpicosecond Resolution," 2008 Symposium on VLSI Circuits Digest of Technical Papers, 2008 IEEE, pp. 112-113.

Moon, et al: "Spectral Analysis of Time-Domain Phase Jitter Measurements," IEEE Transactions on Circuits and Systems—II: Analog and Digital Signal Processing, vol. 49, No. 5, May 2002, pp. 321-327.

Nose, et al: "A 1-ps Resolution Jitter-Measurement Macro Using Interpolated Jitter Oversampling," IEEE Journal of Solid-State Circuits, vol. 41, No. 12, Dec. 2006, pp. 2911-2920.

Rashidzadeh, et al: "An All-Digital Self-Calibration Method for a Vernier-Based Time-to-Digital Converter," IEEE Transactions on Instrumentation and Measurement, vol. 59, No. 2, Feb. 2010, pp. 463-469.

Rolindez, et al: "A SNDR BIST for ΣΔ Analogue-to-Digital Converters," Proceedings of the 24th IEEE VLSI Test Symposium (VTS'06), 2006 IEEE (6 pages).

Tortosa, et al: "Effect of Clock Jitter Error on the Performance Degradation of Multi-bit Continuous-Time ΣΔ Modulators With NRZ DAC," TEC2004-01752/MIC Jan. 2005 (6 pages).

Xia, et al: "On-Chip Jitter Measurement for Phase Locked Loops," Proceedings of the 17th IEEE International Symposium on Defect and Fault Tolerance in VLSI Systems (DFT'02), 2002 IEEE (9 pages).

Yamaguchi, Koichi, et al: "A 2.0 GB/s Clock-Embedded Interface for Full-HD 10-Bit 120 Hz LCD Drivers With 1/5-Rate Noise-Tolerant Phase and Frequency Recovery," IEEE Journal of Solid-State Circuits, vol. 44, No. 12, Dec. 2009, 8 pages.

CN First Office Action and Search Report for counterpart CN Appl. No. 202211504327.3, report dated Sep. 30, 2025, 10 pgs.

* cited by examiner

CLOCK PHASE NOISE MEASUREMENT CIRCUIT AND METHOD

CROSS REFERENCE TO RELATED APPLICATIONS

This application claims priority from United States Provisional Application for Patent No. 63/283,706, filed Nov. 29, 2021, the disclosure of which is incorporated herein by reference.

TECHNICAL FIELD

Embodiments herein generally relate to the detection and measurement of clock phase noise.

BACKGROUND

FIG. 1A shows the waveform of a clock signal in the form of a square wave signal having a period T. FIG. 1B shows the waveform of the clock signal, again in the form of a square wave signal, which exhibits a jitter phenomenon in the time domain (i.e., clock edges are perturbed by phase noise). Clock jitter is a deviation (reference 10) of a clock edge 12 from its ideal location 14, where the ideal location is specified by the period T. As a result, the actual period of the square wave signal may vary over time, positively and/or negatively, with respect to an ideal period T. The offset difference in periods due to the phase noise is undesired in most circuit applications, and thus is it important to be able to test for and measure this phase noise of the clock.

One solution for testing and measuring clock jitter is to use a very precise (i.e., jitter free, with high resolution and accuracy) reference clock signal in comparison with the generated clock signal. It would be preferred if the reference clock signal could be generated on chip, instead of being sourced from off chip. However, there is a significant area penalty that is incurred for the chip to include such a high precision reference clock signal source.

It is also known in the art to measure clock jitter in the time domain. However, the measurement of phase noise which manifests as jitter requires the making of a number of different measurements and the solution is not so straight forward implemented in the time domain.

There is a need in the art for a jitter detection and measurement technique which does not require the use of a precise reference clock signal.

SUMMARY

In an embodiment, a circuit for measuring jitter in a jittery clock signal comprises: a digital sinusoid generator circuit clocked by the jittery clock signal and configured to generate a pulse density modulation (PDM) signal corresponding to a sinusoid waveform; a modulator circuit configured to convert the PDM signal to an oscillating frequency signal and generate digital values indicative of oscillating frequency signal phase; a sampling circuit clocked by the jittery clock signal and configured to sample the digital values indicative of oscillating frequency signal phase; a digital differentiator circuit configured to generate a digital difference signal indicative of a difference between consecutive samples of the digital values indicative of oscillating frequency signal phase; and a digital signal processing circuit configured to process the digital difference signal to determine a measurement of jitter in the jittery clock signal.

In an embodiment, a method for measuring jitter in a jittery clock signal comprises: generating a pulse density modulation (PDM) signal corresponding to a sinusoid waveform, said PDM signal having a period set by pulses of the jittery clock signal; converting the PDM signal to an oscillating frequency signal; generating digital values indicative of oscillating frequency signal phase; sampling the digital values indicative of oscillating frequency signal phase in response to the jittery clock signal; determining a digital difference between consecutive samples of the digital values indicative of oscillating frequency signal phase; and processing said digital difference to determine a measurement of jitter in the jittery clock signal.

In an embodiment, a circuit for measuring jitter in a jittery clock signal comprises: a first sampling circuit configured to sample a pulse density modulation (PDM) signal corresponding to a sinusoid waveform in response to the jittery clock signal to output a voltage; a transconductance stage configured to convert the voltage to a current; a ring oscillator configured to generate an oscillating frequency signal in response to the current; a second sampling circuit clocked by the jittery clock signal and configured to sample bits output from stages of the ring oscillator; a digital differentiator circuit configured to generate a digital difference signal indicative of a difference between consecutive samples of the bits output from stages of the ring oscillator; and an analyzer circuit configured to process the digital difference signal to determine a measurement of jitter in the jittery clock signal.

BRIEF DESCRIPTION OF THE DRAWINGS

For a better understanding of the embodiments, reference will now be made by way of example only to the accompanying figures in which.

DETAILED DESCRIPTION

Figure 1A:
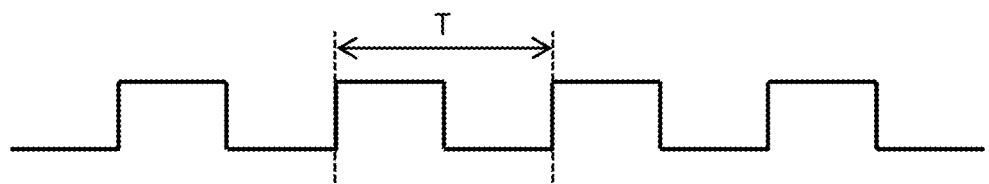
FIGS. 1A and 1B illustrate waveforms for clock signal which are, respectively, jitter-free and perturbed by jitter.
Figure 1B:
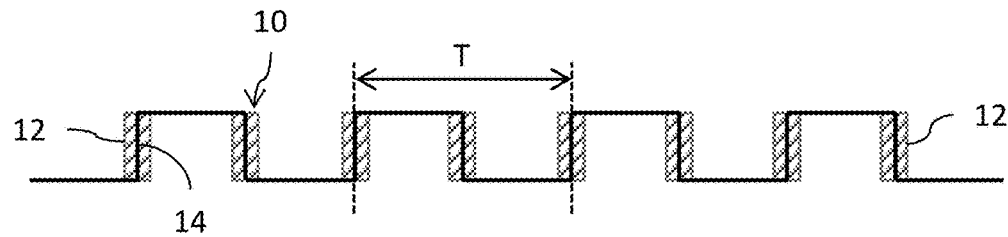
Figure 2:
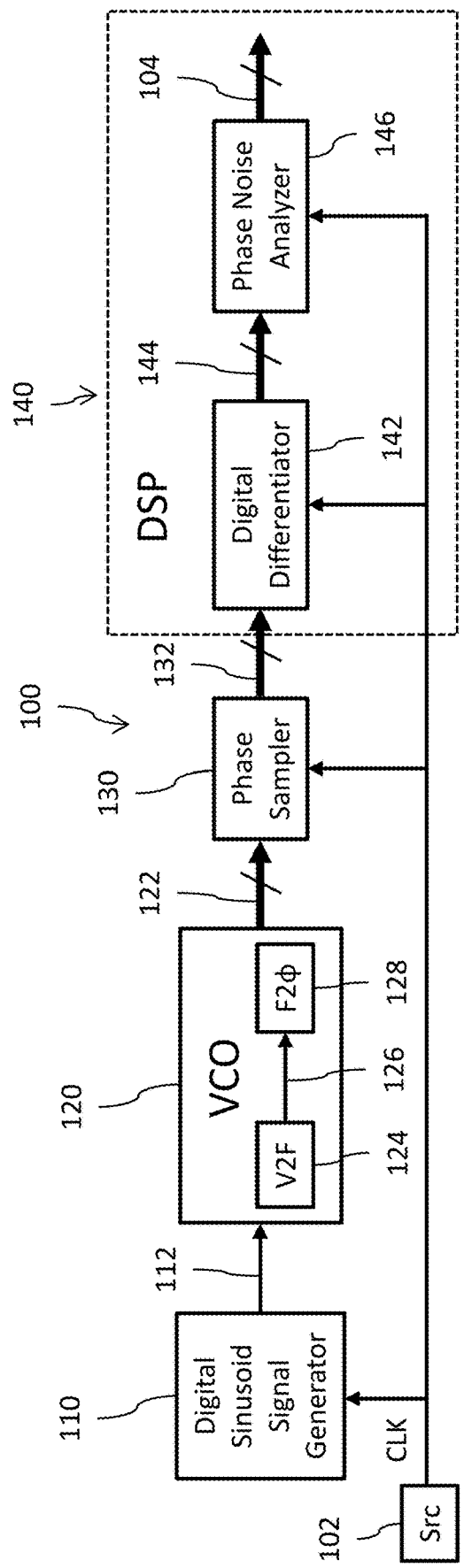
FIG. 2 is a block diagram of a clock signal phase noise measurement circuit.

Reference is now made to FIG. 2 which shows a block diagram of a clock signal phase noise measurement circuit 100. The circuit 100 receives a clock signal CLK from a clock source (Src) 102 (such as an oscillator circuit), where that clock signal CLK is perturbed by jitter (like the clock signal shown in FIG. 1B), and outputs a measurement signal 104 having a digital value indicative of measured phase noise in the clock signal CLK. Details of the oscillator circuit comprising the clock source 102 are not material to the embodiments herein, it being clear that what is of importance is that the clock signal CLK can be a jittery clock signal without regard to how or why the clock signal is perturbed by jitter. In other words, the circuit 100 is agnostic as to clock source 102 and will function to make a phase noise measurement on a received clock signal CLK irrespective of the source of that jittery clock signal. It will also be noted that the circuit 100 does not utilize a high accuracy reference clock, and thus the phase measurement is being made here without reference to such a reference clock (generated either on chip or sourced from off chip) and furthermore without any comparison of the clock signal CLK to such a reference clock.

Figure 3:
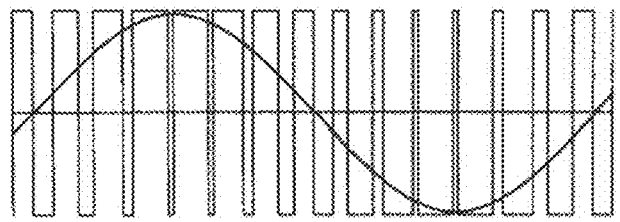
FIG. 3 illustrates a pulse density modulation (PDM) sinusoid.

The phase noise measurement circuit 100 includes a digital signal generator 110 that is clocked by the jittery clock signal CLK and configured to generate a pulse density modulation (PDM) waveform signal 112 corresponding to a sinusoid wave as shown in FIG. 3. The switching frequency of the digital signal generator 110 for the PDM waveform generation is driven by the jittery clock signal CLK (in other words the PDM signal has a period set by pulses of the jittery clock signal), and thus the jitter present in clock signal will have an effect on the PDM waveform signal 112 due to convolution between the jittery clock signal CLK and the PDM signal at the output of the sinusoid generator. In other words, phase noise of the jittery clock signal CLK will have an adverse effect on the shape of the PDM tone whose frequency corresponds to the product of the frequency fs of the clock signal CLK and the pulse density modulation characteristics of the sinusoid waveform. In an embodiment, the digital signal generator 110 is implemented using a read only memory (ROM) which stores the pulse density modulation characteristics of the sinusoid waveform and a single bit digital-to-analog converter (DAC) circuit implemented using a flip flop that is clocked by the jittery clock signal CLK.

The PDM waveform signal 112 is input to a voltage controlled oscillator (VCO) circuit 120 that converts the PDM waveform signal 112 representative of the sinusoid waveform to a sequence of multi-bit digital signals 122 representative of the magnitude of the sinusoid, and hence the instantaneous phase of the sinusoid sampled corresponding to the jittery clock signal CLK. The VCO circuit 120 includes a voltage-to-frequency (V2F) converter circuit 124 that generates an oscillating frequency signal 126 from the PDM waveform signal 112 and a frequency-to-phase (F2φ) converter circuit 128 that generates the sequence of multi-bit digital signals 122 whose digital value correlates to the instantaneous phase of the oscillating frequency signal 126. In an embodiment, the VCO circuit 120 is implemented using a ring oscillator circuit with taps of the ring oscillator providing bits of the multi-bit digital signal 122.

The sequence of multi-bit digital signals 122 output from the VCO circuit 120 are input to a sampling circuit 130 which samples the output of the VCO circuit 120 at a sampling rate controlled by the jittery clock signal CLK to output multi-bit digital sinusoid samples 132. The sampling circuit 130 outputs a sequence of the digital sinusoid samples 132 which correspond to phase measurements. In an embodiment, the sampling circuit 130 is implemented using a plurality of flip-flops clocked by the jittery clock signal CLK.

A digital signal processing (DSP) circuit 140 processes the digital sinusoid samples 132 to determine measured phase noise in the clock signal CLK and output the measurement signal 104. It will be noted that the DSP circuit 140 is clocked by the jittery clock, but the issue of jitter presence is of no concern to the effective implementation of the digital processing operations. The DSP circuit 140 includes a digital differentiator circuit 142 that determines the difference between consecutive multi-bit digital sinusoid samples 132 to generate a multi-bit difference signal 144. The multi-bit difference signals 144 are then processed by a phase noise analyzer circuit 146 of the DSP circuit 140 which calculates a signal-to-noise ratio (SNR) measurement that is indicative of the measured phase noise in the clock signal CLK. In this case, a poor SNR measurement correlates to a higher level of jitter in the clock signal CLK.

In an embodiment, the analyzer circuit 146 is implemented using an on-chip spectrum analyzer (for example, a Discrete Fourier Transform) block that computes the signal energy in the frequency domain. Those skilled in the art understand that there are multiple ways to accomplish this on chip.

Figure 4:
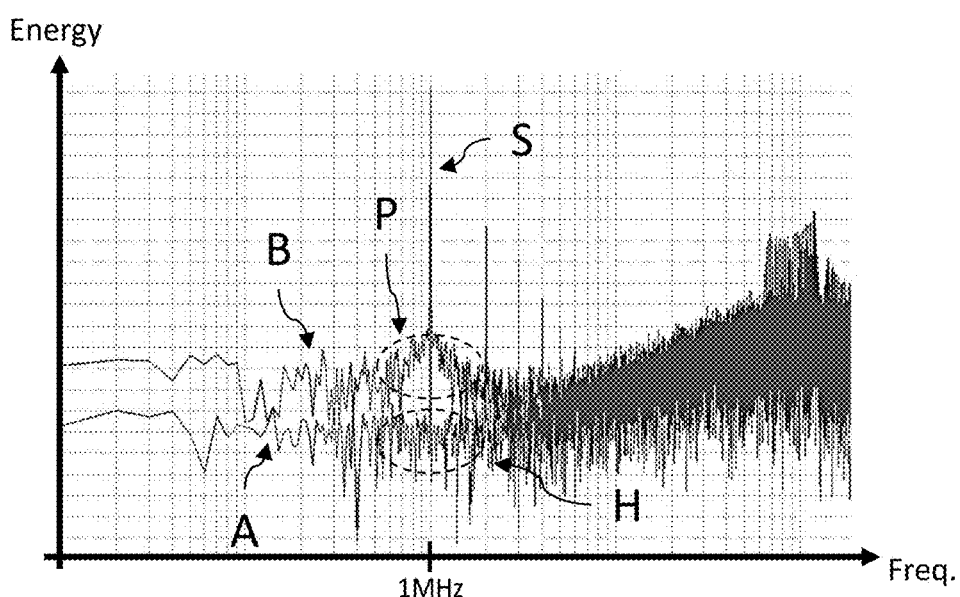
FIG. 4 illustrates frequency spectra for clock signals.

With respect to spectrum analysis that is performed, if the clock CLK from source 102 has a frequency of 500 MHz (fs=500 MHz), and the sinusoid generator 110 stores modulation characteristics for a 0.002*fs sinusoid waveform signal, the processing of the multi-bit difference signals 144 by the phase noise analyzer circuit 146 will produce an output spectrum that includes a PDM tone at 500*0.002=1 MHz. See, FIG. 4 where the spectrum A is for an ideal clock, and spike S is indicative of the PDM tone corresponding to the frequency of the clock signal. If the 500 MHz clock signal is a jittery clock having a phase noise of −60 dbc/Hz at 40 KHz followed by a 20 dB/decade roll-off, the processing of the multi-bit difference signals 144 by the phase noise analyzer circuit 146 will produce an output spectrum having this same PDM tone at 1 MHz. See, FIG. 4 where the spectrum B is for the jittery clock, and spike S is indicative of the PDM tone corresponding to the frequency of the clock signal. However, there is a difference in signal-to-noise ratio between the two spectrums A and B at and around the location of the PDM tone S due to the presence of jitter that is detectable by the phase noise analyzer circuit 146 of the DSP circuit 140. The clock jitter profile will manifest as a deterioration in the SNR of the output spectrum and this can be effectively detected through spectrum analysis. See, FIG. 4, where the area P shows poor SNR for the spectrum B indicative of the present of jitter (in this case, the phase noise of −60 dbc/Hz at 40 KHz followed by a 20 dB/decade roll-off noted above), while the area H shows high SNR for the spectrum A indicative of the absence of jitter (in this case, for an ideal clock with no phase noise).

Figure 5:
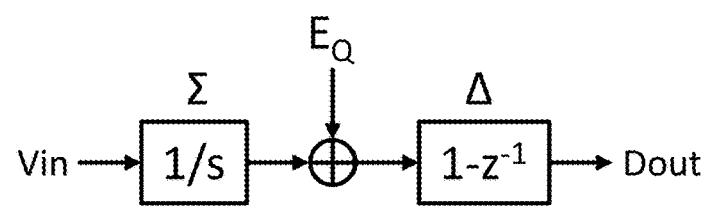
FIG. 5 is a frequency domain block diagram of a sigma-delta modulator circuit for implementing a voltage controlled oscillator in FIG. 2.

The operation of the VCO circuit 120, effectively corresponds to a first order Sigma-Delta (ΣΔ) type modulator having a frequency domain block diagram like that shown in FIG. 5. In this context, the input voltage Vin corresponds to the PDM waveform signal 112, the signal $E_Q$ corresponds to the quantization noise associated with sampling for conversion to digital and the digital output Dout is the noise shaped digital modulator output corresponding to the signal 122.

Figure 6:
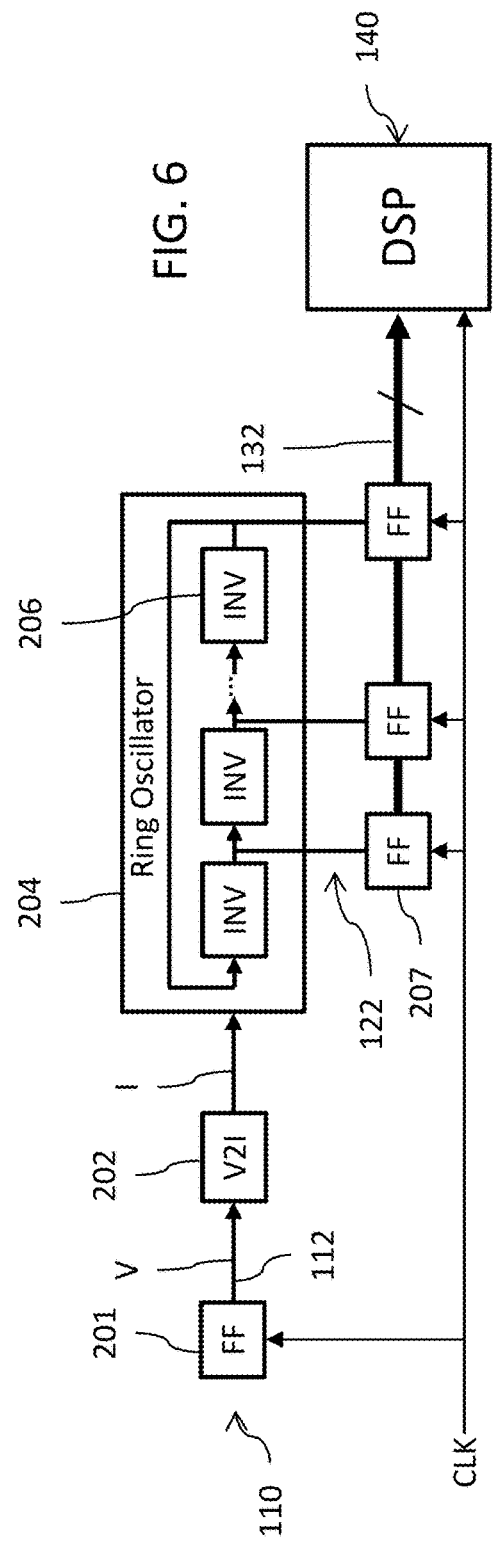
FIG. 6 is a circuit diagram of the circuit shown in FIG. 2.

Reference is now made to FIG. 6 which shows a circuit diagram for efficiently implementing the circuit 100. The signal generator 110 includes a flip-flop 201 clocked by the jittery clock signal CLK to sample the voltage level of the PDM waveform signal 112 and output a voltage V. The voltage V is then converted by a voltage-to-current (V2I) conversion circuit 202 (i.e., a transconductance stage) to a current I. The current I is fed to a multi-stage ring oscillator circuit 204 formed by a plurality of inverter circuits 206 coupled in series with feedback. The oscillator circuit 204 in effect integrates the current I and oscillates at a frequency dependent on the magnitude of the current I. The circuits 202, 204, 206 effectively correspond to the V2F converter circuit 124 of FIG. 2, with the oscillating signal generated by the ring oscillator circuit 204 corresponding to the oscillating frequency signal 126. The taps at the output of the inverters 206 in the ring oscillator circuit 204 provide bits of the multi-bit digital signal 122 output by the VCO which are indicative of phase. The inverter taps effectively correspond to the F2φ converter circuit 128 of FIG. 2. A plurality of flip-flops 207 clocked by the jittery clock signal CLK sample the digital state of the taps at the output of the inverters 206 (i.e., stage outputs) to generate the multi-bit digital sinusoid sample 132 (this operation in effect being a sampling of the instantaneous phase of the oscillating frequency signal 126). The flip-flops 207 correspond to the phase sampler 130 of FIG. 2. The multi-bit digital sinusoid sample 132 is then processed in the DSP 140 by performing digital differentiation and spectrum analysis as described above to determine the SNR and from that determination generate the phase noise measurement signal 104.

The circuit 100 has a number of advantages over prior art circuits. These advantages include: no need for use of a low noise reference voltage signal or clock signal; no need for use of matching capacitive and/or resistive circuitry; no need for the use of complex digital signal processing operations; now need to use of high gain and/or high bandwidth signal loops; and the circuitry can be integrated on-chip and occupy a relatively small circuit area.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

The invention claimed is:

1. A circuit for measuring jitter in a jittery clock signal, comprising:
   a digital sinusoid generator circuit clocked by the jittery clock signal and configured to generate a pulse density modulation (PDM) signal corresponding to a sinusoid waveform;
   a modulator circuit configured to convert the PDM signal to an oscillating frequency signal and generate digital values indicative of oscillating frequency signal phase;
   a sampling circuit clocked by the jittery clock signal and configured to sample the digital values indicative of oscillating frequency signal phase;
   a digital differentiator circuit configured to generate a digital difference signal indicative of a difference between consecutive samples of the digital values indicative of oscillating frequency signal phase; and
   an analyzer circuit configured to process the digital difference signal to determine a measurement of jitter in the jittery clock signal.

2. The circuit of claim 1, wherein the digital differentiator circuit and analyzer circuit are clocked by the jittery clock signal.

3. The circuit of claim 1, wherein said digital sinusoid generator circuit comprises a read only memory (ROM) storing pulse density modulation characteristics of the sinusoid waveform.

4. The circuit of claim 1, wherein the modulator circuit comprises:
   a flip-flop configured to sample the PDM signal in response to the jittery clock signal to output a voltage;
   a transconductance stage configured to convert the voltage to a current; and
   a ring oscillator configured to generate the oscillating frequency signal in response to the current.

5. The circuit of claim 4, wherein the sampling circuit comprises a set of flip-flops configured to store values of digital bits output by stages of the ring oscillator in response to the jittery clock signal.

6. The circuit of claim 1, wherein the modulator circuit comprises a sigma-delta modulator.

7. The circuit of claim 1, wherein the measurement of jitter in the jittery clock signal is made without comparison of the jittery clock signal to a reference clock signal.

8. The circuit of claim 1, wherein the analyzer circuit processes the digital difference signal to determine a signal to noise ratio (SNR) value which is correlated to jitter.

9. The circuit of claim 8, wherein a relatively lower SNR value is indicative of a relatively higher level of jitter present in the jittery clock signal.

10. The circuit of claim 1, wherein the analyzer circuit is a spectrum analyzer configured to generate a frequency spectrum for said PDM signal and determine a signal to noise ratio (SNR) value for said frequency spectrum that is indicative of jitter presence, wherein a relatively lower SNR value is indicative of a relatively higher level of jitter present in the jittery clock signal.

11. A method for measuring jitter in a jittery clock signal, comprising:
   generating a pulse density modulation (PDM) signal corresponding to a sinusoid waveform, said PDM signal having a period set by pulses of the jittery clock signal;
   converting the PDM signal to an oscillating frequency signal;
   generating digital values indicative of phase of the oscillating frequency signal;
   sampling the digital values indicative of phase of the oscillating frequency signal in response to the jittery clock signal;
   determining a digital difference between consecutive samples of the digital values indicative of phase of the oscillating frequency signal; and
   processing said digital difference to determine a measurement of jitter in the jittery clock signal.

12. The method of claim 11, wherein converting comprises:
   sampling the PDM signal in response to the jittery clock signal to output a voltage;
   converting the voltage to a current; and
   generating the oscillating frequency signal in response to the current.

13. The method of claim 11, wherein converting the PDM signal and generating digital values comprises performing a sigma-delta modulation.

14. The method of claim 11, wherein the measurement of jitter in the jittery clock signal is made without comparison of the jittery clock signal to a reference clock signal.

15. The method of claim 11, wherein processing said digital difference comprises generating a frequency spectrum for said PDM signal and determining a signal to noise ratio (SNR) value for said frequency spectrum that is indicative of jitter presence.

16. The method of claim 11, wherein processing said digital difference comprises determining a signal to noise ratio (SNR) value which is correlated to jitter.

17. The method of claim 16, wherein a relatively lower SNR value is indicative of a relatively higher level of jitter present in the jittery clock signal.

18. A circuit for measuring jitter in a jittery clock signal, comprising:
   a first sampling circuit configured to sample a pulse density modulation (PDM) signal corresponding to a sinusoid waveform in response to the jittery clock signal to output a voltage;

a transconductance stage configured to convert the voltage to a current;

a ring oscillator configured to generate an oscillating frequency signal in response to the current;

a second sampling circuit clocked by the jittery clock signal and configured to sample bits output from stages of the ring oscillator;

a digital differentiator circuit configured to generate a digital difference signal indicative of a difference between consecutive samples of the bits output from stages of the ring oscillator; and an analyzer circuit configured to process the digital difference signal to determine a measurement of jitter in the jittery clock signal.

19. The circuit of claim 18, wherein the second sampling circuit comprises a set of flip-flops configured to store bits output from stages of the ring oscillator in response to the jittery clock signal.

20. The circuit of claim 18, wherein the analyzer circuit processes the digital difference signal to determine a signal to noise ratio (SNR) value which is correlated to jitter, wherein a relatively lower SNR value is indicative of a relatively higher level of jitter present in the jittery clock signal.

21. The circuit of claim 18, wherein the analyzer circuit is a spectrum analyzer configured to generate a frequency spectrum for said PDM signal and determine a signal to noise ratio (SNR) value for said frequency spectrum that is indicative of jitter presence, wherein a relatively lower SNR value is indicative of a relatively higher level of jitter present in the jittery clock signal.

* * * * *